United States Patent
Nickel et al.

(10) Patent No.: US 11,047,944 B2
(45) Date of Patent: Jun. 29, 2021

(54) MULTI-POINT MAGNETIC RESONANCE IMAGING

(71) Applicant: Siemens Healthcare GmbH, Erlangen (DE)

(72) Inventors: Marcel Dominik Nickel, Herzogenaurach (DE); Manuel Schneider, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 43 days.

(21) Appl. No.: 16/535,541

(22) Filed: Aug. 8, 2019

(65) Prior Publication Data

US 2020/0049783 A1     Feb. 13, 2020

(30) Foreign Application Priority Data

Aug. 8, 2018    (DE) .......................... 102018213326.3

(51) Int. Cl.
  *G01R 33/56*     (2006.01)
  *G01R 33/48*     (2006.01)

(52) U.S. Cl.
  CPC ..... *G01R 33/5608* (2013.01); *G01R 33/4828* (2013.01)

(58) Field of Classification Search
  CPC ............ G01R 33/5608; G01R 33/4828; G01R 33/56563; G01R 33/56572
  See application file for complete search history.

(56) References Cited

U.S. PATENT DOCUMENTS 9,983,284 B2 *  5/2018  Eggers ................... A61B 5/055
2015/0061672 A1  3/2015  Kannengiesser et al.

FOREIGN PATENT DOCUMENTS

DE       102013217651 A1     3/2015

OTHER PUBLICATIONS

Lugauer F. et al., Robust spectral denoising for water-fat separation in magnetic resonance imaging, International Conference on Medical Image Computing and Computer-Assisted Intervention, pp. 667-674, Oct. 2015.
Liver Fat Quantification Using a Multi-Step Adaptive Fitting Approach with Multi-Echo GRE Imaging Magnetic Resonance in Medicine 72:1353-1365 (2014).

* cited by examiner

*Primary Examiner* — Susan S Lee
(74) *Attorney, Agent, or Firm* — Schiff Hardin LLP

(57) ABSTRACT

A method for multi-point magnetic resonance imaging including: receiving measured magnetic resonance data, which maps the magnetizations of a number of spin species in a measuring range with a number of echo times; carrying out an optimization for determining fitted magnetic resonance data on the basis of the measured magnetic resonance data, wherein an optimization function of the optimization implements a penalty for a higher rank of a matrix representing the fitted magnetic resonance data and a correction term for the localized evolution of a phase of the measured magnetic resonance data by means of field inhomogeneities or by means of a counterrotation of gradient fields with the number of echo times; and applying a spectral model to the fitted magnetic resonance data to determine magnetic resonance images with contrasts which correspond to the number of spin species.

16 Claims, 3 Drawing Sheets

MULTI-POINT MAGNETIC RESONANCE IMAGING

TECHNICAL FIELD

Various examples of the invention relate in general to techniques for multi-point magnetic resonance imaging for generating magnetic resonance images with contrasts which map a number of species. Various examples of the invention relate in particular to techniques for taking into account a correction term for the localized evolution of the phase of the magnetic resonance data by means of field inhomogeneities and/or by means of a counterrotation of gradient fields.

BACKGROUND

Within the scope of magnetic resonance (MR) measurements of nuclear spins, it may be possible to separate spectral portions contained in MR data. The spectral portions can relate to different spin species, e.g. nuclear spins in a fat environment and a water environment. To this end, what are known as "chemical-shift-imaging" multi-point MR measuring sequences are frequently used for this purpose. Such techniques typically take advantage of the effect that the resonance frequency of nuclear spins depends on the molecular or chemical environment. This effect is referred to as chemical shift. Various spin species therefore have different resonance frequencies, from which the measured spectrum of the MR data is composed. E.g. the difference between two resonance frequencies of various spectral portions can be expressed in ppm (parts per million, i.e. 10-6).

The chemical shift between the hydrogen nuclear spins in water and hydrogen nuclear spins in fatty acid chains is often observed as a first spin species and a second spin species in each instance. In this case, it is also possible, however, to differentiate between the various fat-related spin species in accordance with the type of fatty acid chain. In such a case, MR data can be used to determine a MR water image and at least one MR fat image, i.e. individual MR images with a contrast which corresponds to the frequency of the corresponding spin species. This is of interest for the most diverse, e.g. clinical and/or medical applications.

In order to be able to separate spectral portions from one another, MR data is acquired in the multi-point MR imaging with a number of echo times. The MR data corresponds to a superimposition of MR signals of the various spin species. The MR signals of the different spin species have different phase angles at the different echo times. By taking this effect into account, it may be possible to separate the various MR signals.

To this end, a spectral model which links the measured or acquired MR data with various physically relevant variables is used in reference implementations. The various variables comprise in particular the various spectral portions to be determined, and, depending on accuracy, scope and complexity of the spectral model, further properties of the measuring system, in particular interfering influences.

It may then be possible to determine the MR signals taken into account in the spectral model for each pixel of the MR data. To this end, the spectral model can be "fitted" to the MR data for each pixel.

Conventional spectral models comprise a correction term, which describes the interfering influences by means of the measuring system, i.e. for instance the MR system with its components or inherent physical properties of the nuclear spins etc. For instance, the correction term can the localized evolution of the phase of the MR data on account of field inhomogeneities of the basic magnetic field, and/or on account of the counterrotation of gradient fields, which are used to generate gradient echoes in the number of echo times. The correction term can also relate to the magnitude of the MR data, e.g. on account of the relaxation of the magnetization back into the rest position. Depending on the technique, the component parts of the correction term can vary.

BRIEF DESCRIPTION OF THE INVENTION

There is a need for improved techniques for multi-point MR imaging. In particular, there is a need for techniques for multi-point MR imaging, which take into account the localized evolution of the phase of MF data on account of interfering influences in a reliable and less computationally intensive manner.

A method for multi-point MR imaging comprises the receiving of measured MR data. The measured MR data forms the magnetization of a number of spin species in a measuring range with a number of echo times. The method also comprises implementing an optimization in order to determine fitted MR data on the basis of the measured MR data. In this case, an optimization function of the optimization implements a penalty for a higher rank of a matrix, which represents the fitted MR data (signal matrix). Moreover, the optimization function contains a correction term for the localized evolution of a phase of the measured MR data by means of field inhomogeneities and/or by means of a counterrotation of gradient fields with the number of echo times. The method also comprises applying a spectral model to the fitted MR data for the purpose of determining MR images with contrasts which correspond to the number of spin species.

In other words, one such method can describe a two-stage approach, in which the fitted MR data is firstly determined in a first stage and the spectral model is then applied to the fitted MR data in a second stage.

Various advantages and effects can be achieved by means of such a method. For instance, it may be possible to determine interfering influences with greater accuracy or to remove the same from the measured MR data within the scope of the optimization. The MR images can therefore be provided with a particularly high quality; in particular, the concentration of the various spin species could be acquired quantitatively. It is moreover possible for the interfering influences to be removed or at least reduced from the measured MR data within the scope of the optimization without a priori assumptions about the number of spin species. For instance, the optimization can be carried out without a priori assumptions about the specific MR signals, which are superimposed into the MR data. For instance, it may be unknown a priori which fat spin species are mapped in the measuring range, i.e. whether, for instance, unsaturated and/or (single and/or multiple) saturated fatty acids are present etc. Another advantage lies in simplifying subsequent processing steps, which revert back to the fitted MR data: for instance applying the spectral model to the fitted MR data can take place particularly efficiently, because it may be unnecessary for the spectral model to have further correction terms for the localized evolution of the phase of the fitted MR data.

The optimization function can be maximized or minimized within the scope of the optimization. It would be possible, for instance, for the optimization function to comprise a difference between, on the one hand, a combination of the measured MR data with an inversion of the correction term and, on the other hand, the fitted MR data. This can be motivated by the fitted MR data, multiplied by the correction term, resulting in the measured MR data.

The fitted MR data can have comparatively few interfering influences on account of the localized evolution of the phase by means of the field inhomogeneities and/or by means of the counterrotation of gradient fields. This means that the fitted MR data can be demodulated with respect to the localized phase evolution. In this context, the fitted MR data could also be referred to as corrected MR data etc.

Such techniques are based on the knowledge that the assumption of the penalty for the higher rank of the signal matrix is typically effectively justified on account of the underlying physics. The penalty for the higher rank of the signal matrix namely means that a modeling of the measured MR data is aimed for by superimposing as few independent MR signals of different spin species as possible. The rank of the signal matrix corresponds to the number of spin species in the measuring range.

As a general rule, the penalty for the higher rank of the signal matrix can be implemented in different ways. In one example, what is known as the nuclear standard can be applied to the signal matrix, wherein the nuclear standard corresponds to the sum of the singular values; see for instance Lugauer, F., Nickel, D., Wetzl, J., Kannengiesser, S. A., Maier, A. and Hornegger, J., 2015, October. Robust spectral denoising for water-fat separation in magnetic resonance imaging. In International Conference on Medical Image Computing and Computer-Assisted Intervention (pp. 667-674). Springer, Cham (below Lugauer et al.).

In many examples, the degree of the penalty can be fitted in a parameterized manner for the higher rank of the signal matrix, e.g. as a function of the location. One such local dependence can be determined for instance as a function of the position of anatomical features in the measuring range. If e.g. a segmentation of anatomical features is already present as a priori knowledge, it would therefore be possible to take the segmentation into account in conjunction with the degree of the penalty. As a result, it is possible to take into account that a larger number of spin species is expected in many anatomical regions than in other anatomical regions.

It is apparent from the above that the optimization function contains: the penalty for the higher rank of the signal matrix; and the correction term for the localized evolution of the phase. As a general rule, the optimization function could alternatively or additionally also contain other component parts. One example of a further component part is a further penalty implemented by means of the optimization function; the further penalty can penalize a greater localized change in rate of the correction term. This means that jumps in phase between adjacent pixels can be penalized more significantly than a weak and constant development of the phase, for instance. One such consideration of the further penalty can enable, also in the presence of a number of local minima of the optimization function, a robust locating of the physically relevant solution. In particular, continuity between adjacent pixels can be promoted.

Within the scope of the techniques described herein, the number of various spin species can be found out by means of the optimization. This number is a priori undefined and is influenced by the corresponding penalty of the higher rank of the signal matrix. Moreover, it may be possible, for instance within the scope of a singular value breakdown—to separate the MR signals of the various spin species into the fitted MR data. As a result, it may be unnecessary to make a priori assumptions about the various spin species in the spectral model. This means that it need not be stipulated for instance whether specific fat spin species etc. are present. Instead, the spectral model could be fitted to the number of spin species obtained by the optimization. This enables a particularly flexible use under different imaging modalities.

The optimization can take place numerically. Basically, it may be possible for the numerical optimization to be delimited compared with analytical techniques. For instance, iterative techniques, e.g. with respect to solutions of the optimization function, can be carried out within the scope of the numerical optimization. It is also possible, however, for the numerical optimization to also comprise analytical computing steps. The optimization function is sometimes also referred to as target function. The aim of the optimization may be to find out an extreme value, i.e. a maximum or a minimum, for the optimization function. The numerical optimization can generally be carried out on the basis of any optimization technique known per se to the person skilled in the art. It would be possible, for instance, for the optimization to be a Chi square optimization or a Lp standard optimization. The optimization problems can be achieved by means of the Marquardt-Levenberg method for instance.

Different implementations for the correction term of the optimization function are conceivable as a general rule. For instance, a change in the phase on account of field inhomogeneities, for instance expressed by way of a change in the resonance frequency by means of the inhomogeneity of the basic magnetic field, i.e. as a locally changeable frequency variation, can be taken into account. Alternatively or in addition, the counterrotation of gradient fields could be taken into account with the number of echo times, for instance if a bipolar gradient echo MR measuring sequence is used. This can be associated with eddy current effects. Alternatively or in addition, a term which describes the relaxation of the magnetization back into the rest position as a function of the time could however also be taken into account. Alternatively or in addition, a starting phase could also be taken into account for the MR signals, e.g. if only real-value parameters are allowed for the respective spin species. As a general rule, it would therefore be possible for the correction term to comprise at least one of the following component parts: a localized constant reference phase; a locally changeable frequency variation $\omega$ which describes the field inhomogeneities; a locally changeable phase $\varphi$, which describes the eddy current effects; a locally changeable phase $\phi$ which describes a phase of an excitation pulse for measuring the MR data; and a locally changeable relaxation rate R.

It would generally be possible here for the optimization to be carried out together or iteratively alternately for the various component parts of the correction term.

It may occur that the optimization function has a number of (local) minima per pixel (or voxel) of the MR data. Therefore, a selective initialization of the optimization function can take place in various examples, i.e. suitable start values can be selectively sought for the correction term and/or the fitted MR data. The provision of the start values can produce a preference for a minimum of the number of minima. It would therefore generally be possible for a reference value to be obtained for the localized evolution of the phase and a start value of the correction term to be determined on the basis of the reference value.

It is possible to determine the reference value in different ways. This means, in other words, that the a priori knowledge for the initialization of the optimization can be determined in different ways.

A first exemplary technique for determining the reference value comprises a reference measurement in a part of the measuring range, which has a dominant spin species. For instance, the reference measurement could selectively cover a specific organ as part of the measuring range; stored a priori knowledge about the spin species may be present there. Alternatively, within the scope of a second exemplary technique for determining the reference value, it would also be possible to carry out a reference measurement on a known phantom. On the basis of such reference measurements, it would then be possible to apply a conventional technique, for instance a conventional Dixon technique, to the reference MR data. For instance, a further spectral model could be used for this purpose, which contains a correction term on account of interfering influences and a priori knowledge about the number of spin species. One typical example would be a 2-point Dixon technique for water-fat separation. Many reference techniques here use a multi-stage approach for fitting the spectral model, wherein in the first steps a component part of the correction term is adjusted to zero on account of relaxation or the remaining component parts of the correction term are determined by fixing the contribution on account of field inhomogeneities. The result of such techniques can then be used as the reference value. The reference value can be used to initialize the optimization.

The reference value could however, alternatively or in addition, also be used differently. It would also be possible for a constant reference phase, i.e. which does not vary as a function of the location, to be calibrated as a further component part of the correction term, on the basis of the reference value. In turn, the reference value can be obtained in different ways, for instance based on a reference measurement, which is carried out at least in a part of the measuring range with a dominant spin species, and/or a reference measurement on a phantom, and/or the further spectral model fitted to the measured MR data.

The techniques described herein can generally be combined with a position space noise filter. In particular, it would be possible to use a position space noise filter based on a singular value breakdown. One example comprises for instance a bilateral filter. It would be possible here, for instance, for the position space noise filter to be applied to a basic contribution of the signal matrix, wherein the basic contribution is associated with a singular value. This means, in other words, that a filtering is applied to the columns of V in $D=U\Sigma V^\dagger$, wherein D is the signal matrix, and $U\Sigma V^\dagger$ refers to its singular value breakdown. $\Sigma$ contains the singular values. U is a unit matrix. V is the basic matrix with the basic contributions to D in the columns; i.e. individual columns from V correlate with the different spin species. The use of a position space noise filter enables the fitted MR data to be denoised; and an improved quality of the MR images is achieved as a result. If the position space noise filter can be applied in conjunction with the singular value breakdown of the fitted MR data, the use of the position space noise filter is particularly simple; this is because the optimization function already provides a penalty for a higher rank—i.e. a greater number of singular values of the signal matrix.

It would generally be possible here for the position space noise filter to have a local dependence. This local dependence could be determined as a function of a position of anatomical features in the measuring range. This means, for instance, that the position space noise filter could be selectively applied to specific parts of the measuring range, which are associated with known organs etc. By means of such a technique, it is possible, for instance, to prevent the edges from blurring at the transition between organs etc., as may occur with a conventional Gaussian filter, for instance.

As presented above, individual columns in the basic matrix can correlate with the different spin species. It may be necessary here, for instance, to determine specific linear combinations of the columns in the basic matrix in order to obtain the MR signals of the various spin species.

The parameters of the linear combination are not always known. Moreover, the basic matrix typically has a very high noise, so that it may typically be desirable to determine the MR images with the contrasts (corresponding to the various spin species) by fitting the spectral model to the fitted MR data. As a result, the signal-to-noise ratio for the MR images can namely be significantly increased, on account of the additional a priori knowledge which is taken into account within the scope of the spectral model. As an alternative variant, the parameters of the linear combinations of the columns in the basic matrix could however also be determined within the scope of a calibration measurement. In this way the calibration measurement could be restricted for instance to a part of the measuring range, in which a known, dominant spin species is present. For instance, a priori knowledge could be assumed to be that dominant water is present. The correction could then take place on a corresponding, global reference phase, wherefrom the parameters of the linear combinations can be obtained. This corresponds to the "toggling" of the measured spectrum in the frequency space, so that the MR signal of water assumes the correspondingly known frequency.

One apparatus comprises at least one processor, which is designed to carry out the following steps: receiving measured magnetic resonance data, which maps the magnetizations of a number of spin species in a measuring range with a number of echo times; and carrying out an optimization to determine fitted magnetic resonance data based on the measured magnetic resonance data, wherein an optimization function of the optimization implements a penalty for a higher rank of a matrix representing the fitted magnetic resonance data and contains a correction term for the localized evolution of a phase of the measured magnetic resonance data by means of field inhomogeneities and/or by means of a counterrotation of gradient fields with the number of echo times; and applying a spectral model to the fitted magnetic resonance data in order to determine magnetic resonance images with contrasts, which correspond to the number of spin species.

A computer program or a computer program product comprises program code, which can be loaded and executed by at least one processor. The execution of the program code means that the at least one processor executes the following steps: receiving measured magnetic resonance data, which maps the magnetizations of a number of spin species in a measuring range with a number of echo times; and carrying out an optimization to determine fitted magnetic resonance data based on the measured magnetic resonance data, wherein an optimization function of the optimization implements a penalty for a higher rank of a matrix representing the fitted magnetic resonance data and contains a correction term for the localized evolution of a phase of the measured magnetic resonance data by means of field inhomogeneities and/or by means of a counterrotation of gradient fields with the number of echo times; and applying a spectral model to the fitted magnetic resonance data in order to determine magnetic resonance images with contrasts, which correspond to the number of spin species.

An electronically readable storage medium comprises program code, which can be loaded and executed by at least one processor. The execution of the program code means that the at least one processor executes the following steps: receiving measured magnetic resonance data, which maps the magnetizations of a number of spin species in a measuring range with a number of echo times; and carrying out an optimization to determine fitted magnetic resonance data based on the measured magnetic resonance data, wherein an optimization function of the optimization implements a penalty for a higher rank of a matrix representing the fitted magnetic resonance data and contains a correction term for the localized evolution of a phase of the measured magnetic resonance data by means of field inhomogeneities and/or by means of a counterrotation of gradient fields with the number of echo times; and applying a spectral model to the fitted magnetic resonance data in order to determine magnetic resonance images with contrasts, which correspond to the number of spin species.

The program code can therefore comprise control information for the at least one processor.

For instance, the storage medium can be a data carrier, for instance a USB stick or a DVD or a CD ROM.

The features presented above and features described below can be used not just in the corresponding explicitly presented combination but also in other combinations, or in isolation, without departing from the scope of protection of the present invention.

DETAILED DESCRIPTION OF EMBODIMENTS

Figure 1:
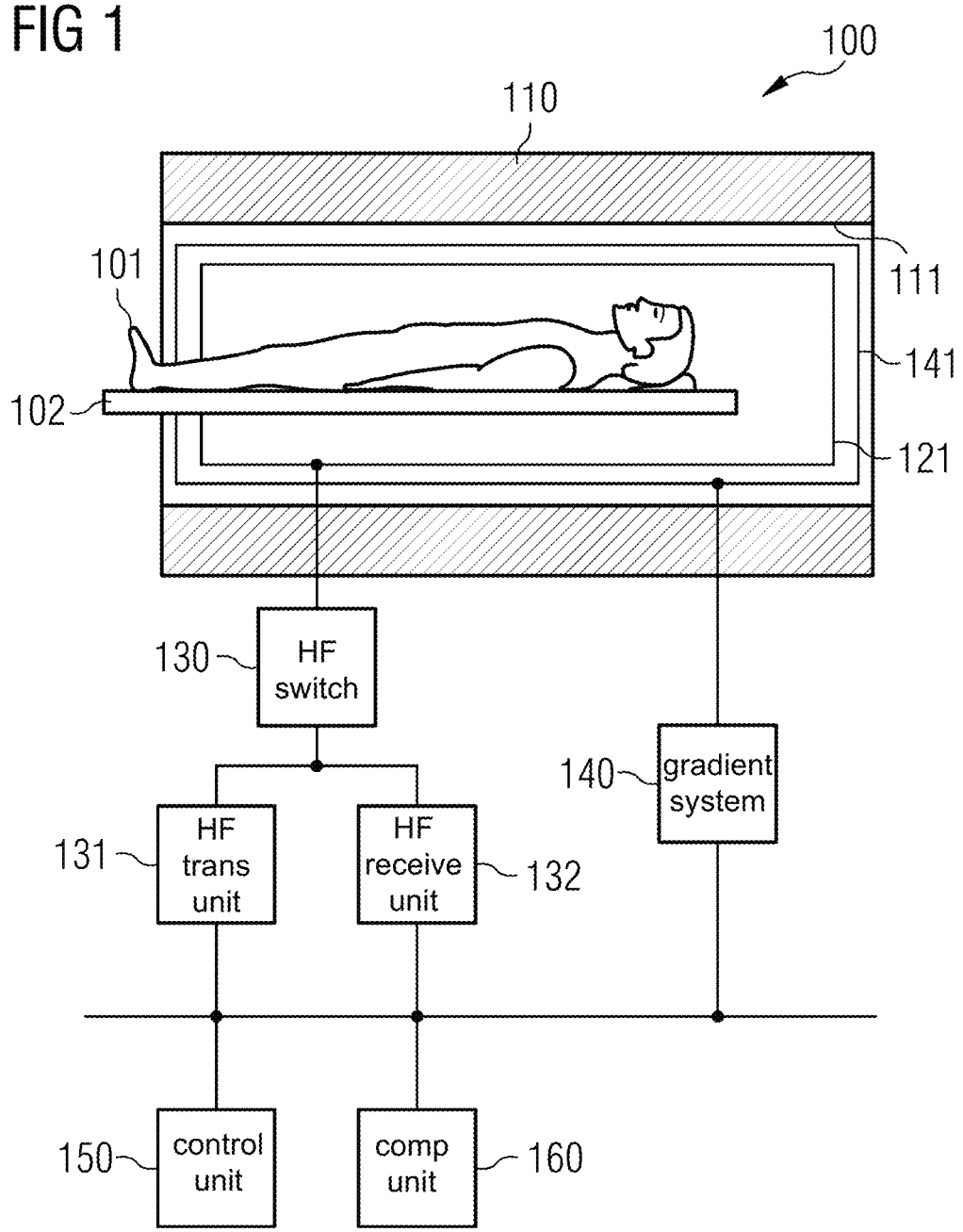
FIG. 1 illustrates a schematic representation of an MR system according to various examples.

The above-described properties, features and advantages of this invention and the manner in which these are achieved will be described more clearly and explicitly in conjunction with the following description of the exemplary embodiments, which are explained in more detail in conjunction with the drawings.

The present invention is described in greater detail below using preferred embodiments with reference to the drawings. In the drawings, the same reference signs denote the same or similar elements. The figures are schematic representations of different embodiments of the invention. Elements depicted in the figures are not necessarily shown true to scale. Rather, the different elements shown in the drawings are reproduced so that their function and general purpose are comprehensible to a person skilled in the art. The links and couplings shown in the figures between the functional units and elements can also be implemented as an indirect link or coupling. A link or coupling can be implemented wire-bound or wirelessly. Functional units can be implemented as hardware, software or a combination of hardware and software.

Techniques are shown below, by means of which a first spectral portion and a second spectral portion can be determined from MR data, i.e. the MR signals of different spin species can be determined. E.g. the first spectral portion can indicate a fat content, abbreviated below to fat, and the second spectral portion can indicate a water content, abbreviated below to water. However, any spin species can generally be considered to be the first and second spectral portion, in other words for instance also silicon etc. In general more than two spin species can be taken into account, e.g. saturated and unsaturated fatty acids and water etc.

The MR data is acquired by means of a multi-point MR measuring sequence: i.e. MR signals are acquired for the number of spin species with a number of echo times. Examples of corresponding multi-point MR measuring sequences comprise gradient echo sequences, as described here, for instance: X. Zhong, M. D. Nickel, S. A. Kannengiesser, B. M. Dale, B. Kiefer, and M. R. Bashir, "Liver fat quantication using a multi-step adaptive fitting approach with multi-echo gre imaging," Magn. Reson. Med., vol. 72, no. 5, pages 1353-1365, 2014.

In many examples, a correction term is taken into account. The correction term can model a phase evolution of the MR data in the position space and a period of time on account of interfering influences. A typical correction term $\Phi(x)$ reads:

$$\phi(x)_{ef} = \delta_{ef} \exp(i\varnothing(x) \pm i\varphi(x) + i\omega(x)T_e - R(x)T_e), \tag{1}$$

wherein $\phi(x)$ corresponds to the initial phase on account of the excitation pulse, if and provided the MR signals of the various spin species are assumed to be real values, $\varphi(x)$ is the half phase difference between the gradient echoes with opposed polarity of the gradient fields and the prefactor ± toggles between these counterrotation gradient fields, $\omega(x)$ is the frequency shift on account of field inhomogeneities, $R(x)$ the relaxation rate, $T_e$ the respective echo time (of overall $N_E$ echos) and x is the position space coordinate, i.e. indicates voxels. e and f are indices which run over the echos. $\Phi(x)$ is diagonal, i.e. the use of the Kroneker-Delta $\delta_{ef}$. It would also be possible to take into account a global phase, which can describe a constant offset for $\phi(x)$ and $\omega(x)$, for instance.

In this way equation (1) is only an example. Therefore, other correction terms were proposed in the literature in the event of the interleaved acquisition with a number of echo trains. It would also be possible to take into account only individual or other component parts from equation (1).

Then $d_e(x)$ would be the measured MR data for an echo time $T_e$ with pixel/voxel x, wherein e indicates the echo times of 1 . . . $N_E$.

Then the MR data in the reference implementations can be shown as:

$$d(x) = \phi(x) A V(x), \tag{2}$$

wherein A is a $N_E \times N_C$ matrix, which describes an ideal phase evolution without phase shift and relaxation for a number of $N_C$ spin species in each column. $V(x)$ is a $N_C$-dimensional vector of the MR signals of the various spin species and is sometimes also referred to as basic matrix.

Various examples are based on the knowledge that after removing the correction term $\Phi(x)$ all typical spectral models assume the same linear superposition for each voxel x. This motivates the assumption that the basis of the solution space for the superimposition of the MR signals for forming the MR data has a small dimension which is constant for all voxels. The solution space is covered by A, see equation (2). This means that a lower rank can be stipulated for the fitted MR data $D(x)$ corrected about the correction term and worded in general.

By the measured MR data being acquired with a large number $N_x$ of pixels, the following can be achieved by stipulating a small rank for $D(x)$: (i) the correction term $\Phi(x)$ can—possibly as far as a global phase shift—be determined without a priori knowledge about A (i.e. about a priori knowledge about the spin species involved). (ii) Moreover, the solution space covered by A can be determined without knowledge of the spin species involved.

According to various examples, an optimization is carried out, in order to determine the fitted MR data D(x) and the correction term Φ(x). The optimization function can be worded as follows:

$$S[D(x), R(x), \omega(x), \varphi(x), \phi(x)] = \sum_x \frac{1}{2} \|\Phi^{-1}(x)d(x) - D(x)\|_2^2 + \quad (3)$$
$$R^{(rank)}[D(x)] + R^{(smoothness)}[\omega(x), \varphi(x), \phi(x)],$$

wherein $\Sigma x \frac{1}{2} \|\Phi^{-1}(x)d(x) - D(x)\|_2^2$ is a difference between a combination of the measured MR data d(x) with the inverted correction term $\Phi(x)^{-1}$ and the fitted MR data D(x). Instead of the euclidean standard for the difference used in equation (3), another standard could also be used.

$R^{(rank)}[D(x)]$ implements a penalty for a higher rank of the fitted MR data and could be implemented by the nuclear standard, for instance, see equation (4).

$R^{(smoothness)}[\omega(x),\varphi(x),\phi(X)]$ implements a further penalty for a greater local change in rate of the correction term; this is generally optional.

E.g. equation (3) could be implemented specifically as follows:

$$S[D(x),R(x),\omega(x),\varphi(x),\phi(x)] = \Sigma x \frac{1}{2} \|\Phi^{-1}(x) d(x) - D(x)\|_2^2 + \lambda \|D(x)\|_*, \quad (4)$$

wherein $\lambda \|D(x)\|$ refers to the nuclear standard and $\lambda$ is a regularization factor, which can be location dependent $\lambda=\lambda(x)$, in order to implement the degree of the penalty for a higher rank in a location-dependent manner. This can take place for instance by taking into account anatomical features in the measuring range, e.g. when it is known that dominant spin species prevail there, etc. To this end, e.g. techniques, as described in conjunction with the afore-cited publication Lugauer et al., can be used.

The proximity operator for the nuclear standard is known in analytical form from the literature. A convergent optimization problem can therefore be immediately implemented based on equations (4). For instance, an optimization for the penalty term and the difference could alternatively be implemented in each voxel. It is essentially possible here for the various component parts of the correction term to be optimized individually or together.

The optimization can be initialized, i.e. based on a start value for the correction term Φ(x), which can be determined from a reference measurement on a part of the measuring range or on a phantom. A conventional Dixon technique (for instance with a fixed fat model) could be used to determine the start value. Such techniques could also be used to determine φ(x) and ω(x) and R(x) in equation (1).

Equation (4) is only an example. Other or further terms could generally also be taken into account. One example would be taking into account a boundary condition in conjunction with the relaxation. For instance, situations may occur, in which the optimization function according to equations (4) is perhaps not defined in conjunction with high relaxation rates R (see equation (1)). It may then be useful to take a further relaxation term into account.

Equation (4) contains no a priori assumptions about the number and type of the observed spin species.

The optimization according to equation (4) could generally also be carried out for a part of the measuring range. For instance, a sliding window approach or a plot-by-plot optimization according to equation (4) could be carried out.

An MR system 100 can be used to acquire MR data. FIG. 1 shows an MR system 100 which is configured to carry out corresponding techniques, methods and steps according to the invention. The MR system 100 has a magnet 110 which defines a tube 111. The magnet 110 can generate a basic magnetic field parallel to its longitudinal axis. The basic magnetic field can have field inhomogeneities, that is, local deviations from a target value. An object under examination, in this case a person under examination 101, can be pushed into the magnet 110 on a patient table 102. The MR system 100 also has a gradient system 140 for generating gradient fields, which are used for MR imaging and for spatial encoding of acquired raw data. The gradient system 140 typically comprises at least three gradient coils 141 which are separately controllable and positioned in a well-defined way. The gradient coils 141 enable the gradient fields to be applied and switched along particular spatial directions (gradient axes). Eddy current effects, which bring about local magnetic fields, can be induced by switching the gradient fields. The gradient fields can be used for instance for slice selection, for frequency encoding (in the read-out direction) and for phase encoding. As a result, a local encoding of the raw data can be achieved. The spatial directions, which are in each case parallel to slice selection gradient fields, phase encoding gradient fields and read-out gradient fields, need not necessarily be coincident with the machine coordinate system. They can, instead, be defined in relation to a k-space trajectory, which can be defined in turn on the basis of specific requirements of the respective MR measuring sequence and/or on the basis of anatomical properties of the examination person 101.

In order to excite the polarization or alignment of the nuclear spins or magnetization in the longitudinal direction which is produced in the basic magnetic field, an HF coil arrangement 121 is provided, which can irradiate an amplitude-modulated HF excitation pulse into the examination person 101. As a result, a transversal magnetization can be generated. In order to generate such HF excitation pulses, an HF transmit unit 131 is connected via an HF switch 130 to the HF coil arrangement 121. The HF transmit unit 131 can comprise an HF generator and an HF amplitude modulation unit. The HF excitation pulses can tilt the transverse magnetization one-dimensionally slice-selectively or two-dimensionally/three-dimensionally positionally selectively or globally out of the rest position.

Furthermore, an HF receiving unit 132 is coupled via the HF switch 130 to the HF coil arrangement 121. By means of the HF receiving unit 132, MR signals of the relaxing transverse magnetization can be acquired as MR data, for example, by inductive coupling into the HF coil arrangement 121.

It is possible, in general, to use separate HF coil arrangements 121 for radiating in the HF excitation pulses by means of the HF transmitter unit 131 and for acquisition of the MR data by means of the HF receiver unit 132. For example, for radiating in HF pulses, a volume coil 121 can be used and for the acquisition of raw data, a surface coil (not shown), which consists of an array of HF coils can be used. For example, the surface coil for the acquisition of raw data can consist of 32 individual HF coils and can therefore be particularly suitable for the partial parallel acquisition. Corresponding techniques are known to the person skilled in the art, so that no further details have to be explained here.

The MR system 100 also has a control unit 150 which can comprise, for example, a screen, a keyboard, a mouse, etc. By means of the control unit 150, user input can be acquired and output to the user can be realized. For example, it is possible by means of the control unit 150, to set individual operating modes or operating parameters of the MR system through the user and/or automatically and/or under remote control.

Furthermore, the MR system 100 has a computer unit 160. The computer unit 160 can be configured to carry out various calculation operations in the context of the determination of MR images with contrasts, which have different spin species.

Figure 2:
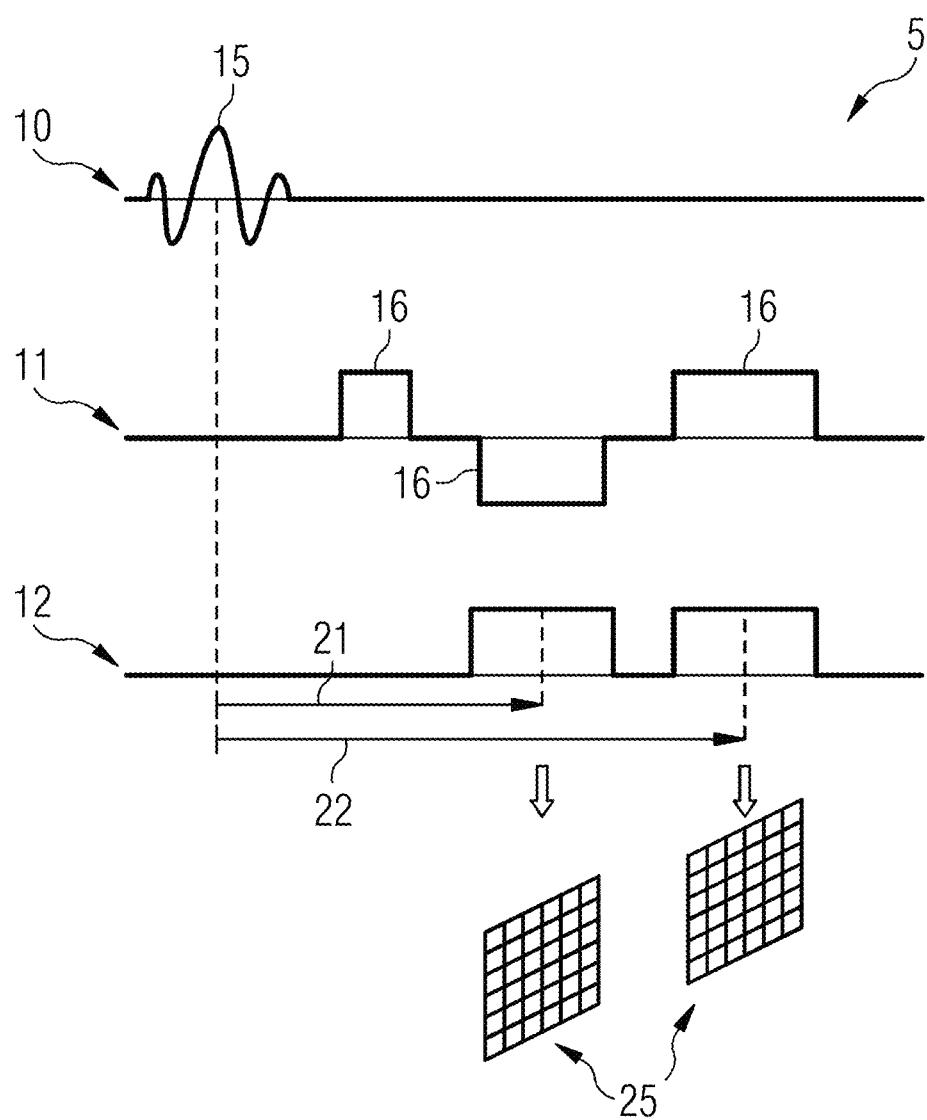
FIG. 2 illustrates a schematic representation of a multi-point MR sequence according to various examples.

FIG. 2 shows a two-point MR measuring sequence 5, which can be used in conjunction with the acquisition of MR data. A high frequency component 10, a gradient field component 11, and a read-out channel 12 are shown. An HF-excitation pulse 15 is firstly radiated in. Read-out gradient fields 16 are then switched, which form two gradient echoes in the first echo time 21 and the second echo time 22. The MR data 25 is obtained by the analog-digital conversion, graphically indicated by the measuring blocks on the read-out channel 12, namely at each echo time 21, 22 $T_E=1 \ldots N_E$, wherein in the example in FIG. 2 $N_E=2$. The first and second echo times 21, 22 are defined with respect to what is known as the iso-delay time instant of the HF excitation pulse 15, which lies e.g. approximately in the center of the HF excitation pulse with a SINC amplitude envelope. Other definitions of the first and second echo time 21, 22 are possible and need not be discussed in more detail in this context.

FIG. 2 is a simplified representation, since at least one slice selection gradient field and one phase encoding gradient field, which are typically required for the complete spatial encoding of a pixel of the MR data 25, are not shown. The MR data 25 is triggered for various pixels (illustrated by the grid in FIG. 2), so that the further gradient fields are typically also used for spatial encoding. The pixels are indicated with x.

While a bipolar gradient echo MR measuring sequence is shown in FIG. 2, other multi-point MR measuring sequences can also be used. For instance, a spin echo MR measuring sequence could be used or a monopolar gradient echo MR measuring sequence (wherein typically $\varphi=0$ in equation (1)).

Figure 3:
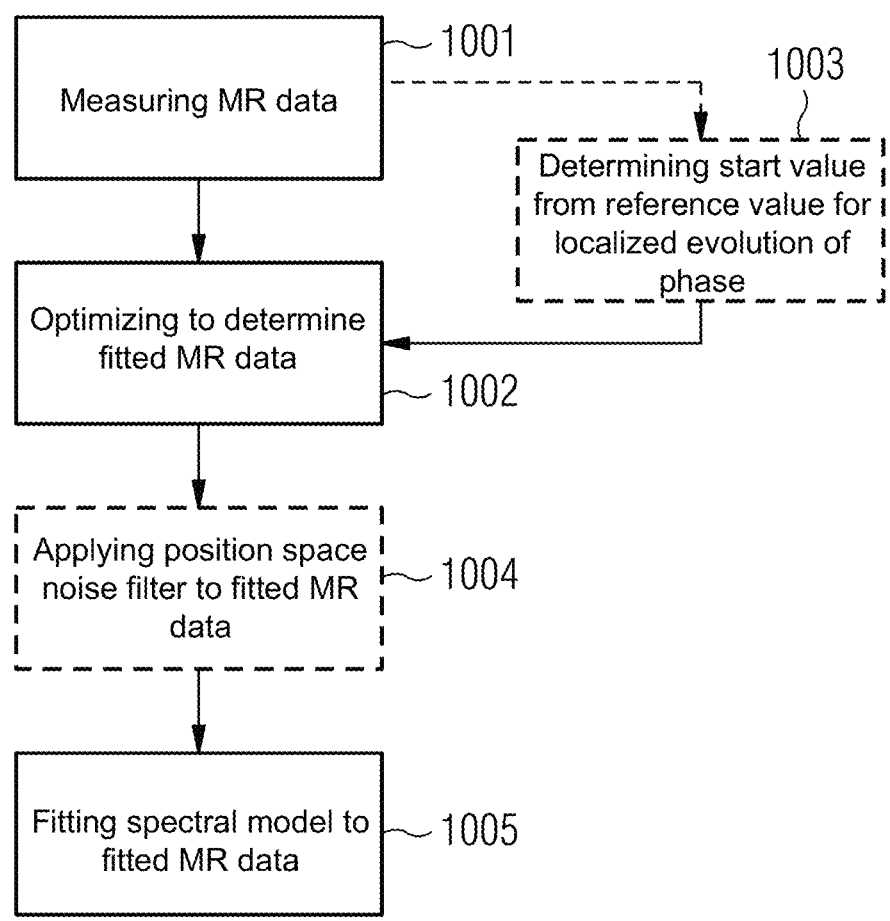
FIG. 3 shows a flow chart of an exemplary method.

FIG. 3 shows a flow chart of an exemplary method. MR data is firstly measured in block 1001, said MR data mapping the magnetizations in a measuring range with a number of echo times.

For instance, a bipolar multi-point gradient echo measuring sequence could be used.

The implementation of an optimization to determine fitted MR data then takes place in block 1002. In this case the optimization has an optimization function, for instance according to equation (3) or equation (4). The optimization function here can minimize a difference between the fitted MR data and the measured MR data corrected by a correction term, compare with equation (1) for instance. Moreover, the optimization function can provide a penalty for a higher rank of a signal matrix representing the fitted MR data, for instance by way of the nuclear standard.

The correction term can model various interfering influences on the measured MR data. For instance, the correction term could therefore contain the localized evolution of the phase of the measured MR data by means of field inhomogeneities of the basic magnetic field, which is used when acquiring the MR data. A further exemplary component part of the correction term would be a phase on account of the counterrotation of the gradient fields with bipolar gradient echo measuring sequences. One or more such component parts of the correction term can be adjusted simultaneously or alternately iteratively within the scope of the optimization.

The optimization could be initialized by specific start values for the various component parts of the optimization function. This means, in particular, that specific start values can be provided for the various component parts of the correction term. One or more such start values could be determined from a reference value for the localized evolution of the phase, block 1003. In one example, the reference value could be determined from reference measurements: for instance within the scope of a calibration, the basic magnetic field of the MR system can be measured, so that, afflicted with a specific inaccuracy, a start value for the phase evolution of the measured MR data can be present on account of the field inhomogeneities. In a further example, the reference measurements could be obtained from the measurements of the MR data in block 1001 itself (see dashed arrow between block 1001 and block 1003 in FIG. 3). For instance, a conventional Dixon technique could be applied to the measured MR data in a part of the measuring range, in which, for instance, only two spin species (water and fat) are assumed within the scope of the spectral model, wherein the spectral model can be adjusted in the part of the measuring range together with a corresponding correction term. The part of the measuring range can be selected here such that there the a priori assumptions (in other words for instance the assumption that there are only two spin species present there) are relevant with high reliability. Good start values can also be obtained in this way, for instance for the global phase etc.

Applying a position space noise filter to the fitted MR data then takes place in the optional block 1004. The position space noise filter could have a local dependence, which depends for instance on a position of anatomical features in the measuring range. The position space noise filter could be applied to a basic amount of the signal value matrix associated with a singular value.

After executing block 1002 or block 1004, it would be possible to determine a linear combination from the various basic contributions of the signal matrix associated with singular values. Parameters of the linear combination, i.e. the coefficients of the linear combinations, can be determined in turn for instance on the basis of a reference measurement, as described above in conjunction with block 1003. These linear combinations can then describe the MR signal of an actual chemical spin species relating to the MR data. Such techniques can be used for the calibration of a global phase shift. As a result, a quantitative evaluation can be enabled.

A spectral model is then fitted to the fitted MR data in block 1005. As a result, MR images can be determined, which each have a contrast which corresponds to a specific spin species. The fitting of the spectral model need not take into account a further correction term in conjunction with the phase evolution on the basis of interfering influences, because the fitted MR data has already been preconditioned in this respect within the scope of the optimization from block 1002. Moreover, the spectral model need not make any a priori assumption about the number and type of existing spin species. This can instead be determined from the rank of the fitted MR data.

The spectral model in block 1005 can assume a fixed number of maxima with fixed frequencies, for instance, wherein the number of the maxima corresponds to the rank of the adjusted MR data. The width of the maxima can also be fixed, e.g. in an extreme case to zero, because within the scope of the optimization in the fitted data the relaxation has been reduced or eliminated.

In summary, afore-cited techniques for the spectral development and possible denoising have been described and can be combined with a correction term for the phase evolution on account of interfering influences. The rank of a signal matrix, which describes accordingly fitted MR data, can be minimized; this applies at least to a part of a measuring range. A smooth phase evolution in the local space can optionally be promoted.

Naturally the features of the previously described embodiments and aspects of the invention can be combined with one another. In particular, the features can be used not only in the combinations described, but also in other combinations or individually, without departing from the field of the invention.

The invention claimed is:

1. A method for multi-point magnetic resonance (MR) imaging, comprising:
receiving measured MR data that maps magnetizations of each one of a plurality of spin species in a measuring range with a plurality of echo times;
carrying out an optimization for generating fitted MR data on the basis of the measured MR data using an optimization function that implements a penalty for a higher rank of a matrix representing the fitted MR data and a correction term for a localized evolution of a phase of the measured MR data using field inhomogeneities or using a counterrotation of gradient fields with the plurality of echo times,
wherein the generation of the fitted data via the optimization function reduces interfering influences from the measured MR data; and
applying a spectral model to the fitted MR data to identify each separate one of the plurality of spin species in the measuring range; and
generating a plurality of MR images based upon the identified separate ones of the plurality of spin species in the measuring range such that each one of the plurality of MR images has a contrast that corresponds to a different one of the plurality of spin species.

2. The method as claimed in claim 1, wherein the spectral model is calculated without using data about the plurality of spin species in the measuring range.

3. The method as claimed in claim 1, wherein the spectral model comprises no further correction term for the localized evolution of the phase of the fitted MR data.

4. The method as claimed in claim 1, further comprising:
obtaining a reference value for the localized evolution of the phase of the measured MR data; and
determining a start value of the correction term on the basis of the reference value.

5. The method as claimed in claim 4,
wherein the reference value is obtained based on at least one of (i) a reference measurement in one part of the measuring range with a dominant spin species, (ii) a reference measurement on a phantom, or (iii) a further spectral model that is fitted to the measured MR data using a noise contribution and data about the plurality of spin species in the measuring range.

6. The method as claimed in claim 1, wherein a degree of the penalty for the higher rank of the matrix has a local dependence.

7. The method as claimed in claim 6, wherein the local dependence of the degree of the penalty is determined for the higher rank of the matrix as a function of a position of anatomical features in the measuring range.

8. The method as claimed in claim 1, wherein the optimization function implements a further penalty for a greater local change in rate of the correction term.

9. The method as claimed in claim 1, wherein the correction term comprises at least one of the following component parts:
a localized constant reference phase;
a localized changeable frequency variation that describes the field inhomogeneities;
a localized changeable phase that describes the counterrotation of gradient fields;
a localized changeable phase that describes a phase of an excitation pulse for measuring the MR data; or
a localized changeable relaxation rate.

10. The method as claimed in claim 9, further comprising:
calibrating the constant reference phase on the basis of at least one of (i) a reference measurement in one part of the measuring range with a dominant spin species, (ii) a reference measurement on a phantom, or (iii) a further spectral model fitted to the measured MR data with a noise contribution and using data about the plurality of spin species in the measuring range.

11. The method as claimed in claim 1, further comprising:
determining a linear combination from basic contributions of the matrix associated with singular values on the basis of at least one of (i) a reference measurement in a part of the measuring range with a dominant spin species, (ii) a reference measurement on a phantom, or (iii) a further spectral model fitted to the MR data with the correction term and using data about the plurality of spin species in the measuring range,
wherein the linear combination represents a signal contribution of a chemical spin species to the MR data.

12. A method as claimed in claim 1, wherein the optimization is carried out together for a number of component parts of the correction term.

13. The method as claimed in claim 1, further comprising:
applying a position space noise filter to at least one basic contribution of the matrix associated with a singular value.

14. The method as claimed in claim 13, wherein the position space noise filter has a local dependence, which is determined as a function of a position of anatomical features in the measuring range.

15. The method as claimed in claim 1, wherein the optimization function comprises a difference between (i) a combination of the measured MR data with an inversion of a noise term, and (ii) the fitted MR data.

16. An apparatus, comprising:
a coil arrangement configured to generate magnetic resonance (MR) signals; and
at least one processor configured to:
receive measured MR data based upon the MR signals, the received measured MR data mapping magnetizations of each one of a plurality of spin species in a measuring range with a plurality of echo times;
carry out an optimization for generating fitted MR data on the basis of the measured MR data, wherein an optimization function that implements a penalty for a higher rank of a matrix representing the fitted MR data and a correction term for the localized evaluation of a phase of the measured MR data using field inhomogeneities or using a counterrotation of gradient fields with the plurality of echo times, wherein the generation of the fitted data via the optimization function reduces interfering influences from the measured MR data;
apply a spectral model to the fitted MR data to identify each separate one of the plurality of spin species in the measuring range; and
generate a plurality of MR images based upon the identified separate ones of the plurality of spin species in the measuring range such that each one of the plurality of MR images has a contrast that corresponds to a different one of the plurality of spin species.

\* \* \* \* \*